(12) United States Patent
Lee et al.

(10) Patent No.: US 7,081,391 B2
(45) Date of Patent: Jul. 25, 2006

(54) INTEGRATED CIRCUIT DEVICES HAVING BURIED INSULATION LAYERS AND METHODS OF FORMING THE SAME

(75) Inventors: Byeong-chan Lee, Gyeonggi-do (KR); Si-young Choi, Gyeonggi-do (KR); Jong-ryeol Yoo, Gyeonggi-do (KR); Yong-hoon Son, Gyeonggi-do (KR); In-soo Jung, Gyeonggi-do (KR); Deok-hyung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 10/722,193

(22) Filed: Nov. 26, 2003

(65) Prior Publication Data

US 2005/0179073 A1   Aug. 18, 2005

(30) Foreign Application Priority Data

Nov. 26, 2002   (KR) .............................. 2002-73872
Jun. 24, 2003   (KR) .............................. 2003-41211

(51) Int. Cl.
*H01L 21/336* (2006.01)

(52) U.S. Cl. .................. 438/282; 257/E29.27

(58) Field of Classification Search .............. 438/142, 438/149, 197, 198, 261–264, 266, 270, 272, 438/276, 279, 282, 283, 284, 311, 422–427, 438/175; 257/E29.257, E29.26, E29.261, 257/E29.27, E29.242
See application file for complete search history.

(56) References Cited

U.S. PATENT DOCUMENTS

| 6,482,714 B1* | 11/2002 | Hieda et al. ................. 438/416 |
| 6,600,170 B1* | 7/2003 | Xiang .......................... 257/18 |
| 6,906,384 B1* | 6/2005 | Yamada et al. ............. 257/347 |
| 2004/0038488 A1* | 2/2004 | Mouli ......................... 438/292 |

FOREIGN PATENT DOCUMENTS

| JP | 02-135781 | 5/1990 |
| KR | 1019970048109 | 4/1999 |
| KR | 100272507 | 8/2000 |

OTHER PUBLICATIONS

Notice to File a Response/Amendment to the Examination Report for Korean patent application no. 10-2003-*0041211 mailed on May 30, 2005.

* cited by examiner

*Primary Examiner*—Brook Kebede
(74) *Attorney, Agent, or Firm*—Myers Bigel Sibley & Sajovec PA

(57) ABSTRACT

An integrated circuit device includes a gate electrode formed on an active region of an integrated circuit device and on a field isolation layer adjacent to the active region. A source region and a drain region are in the active region on alternate sides of the gate electrode. At least one buried insulation layer is beneath the drain region or the source region.

13 Claims, 20 Drawing Sheets

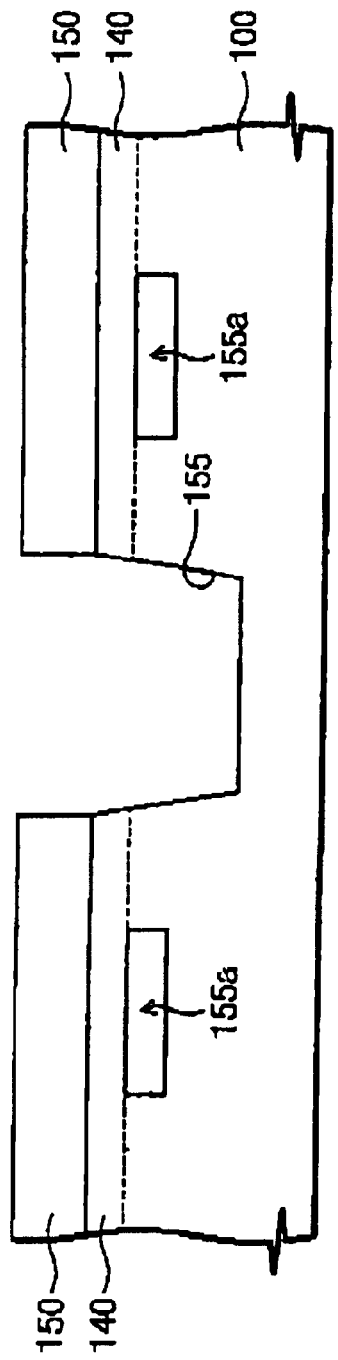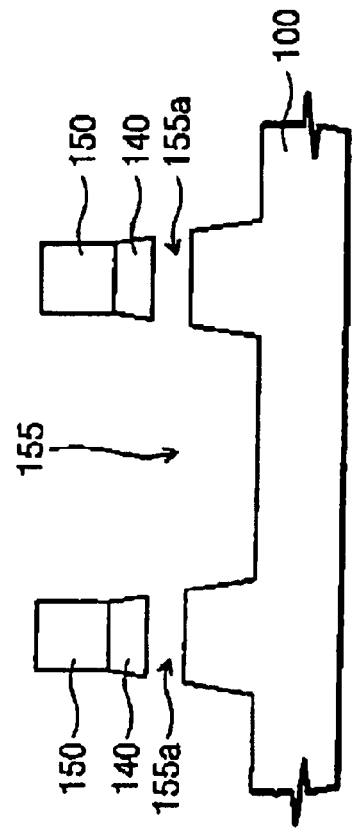

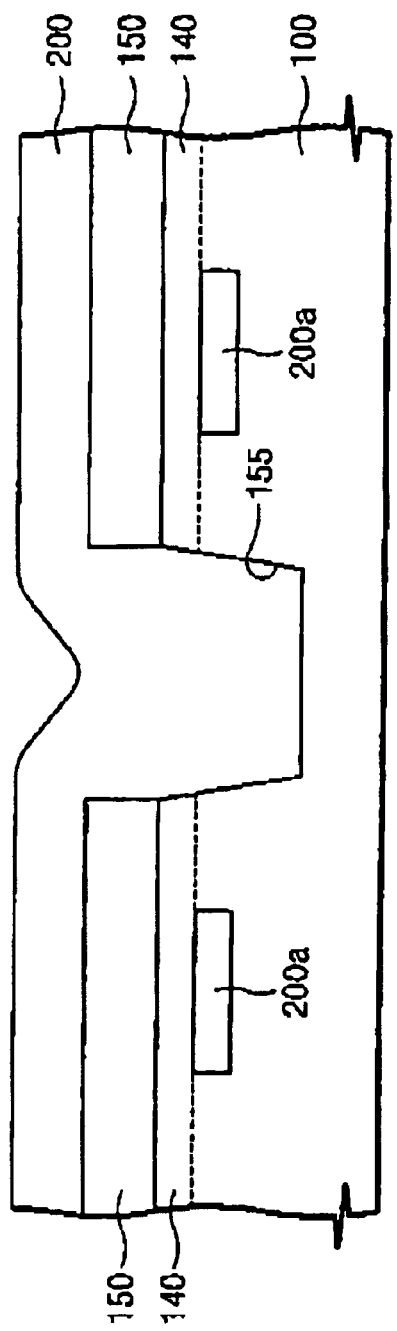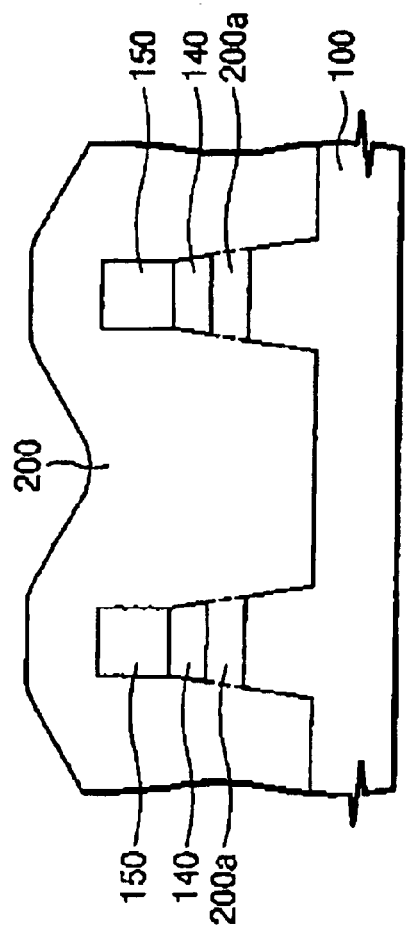

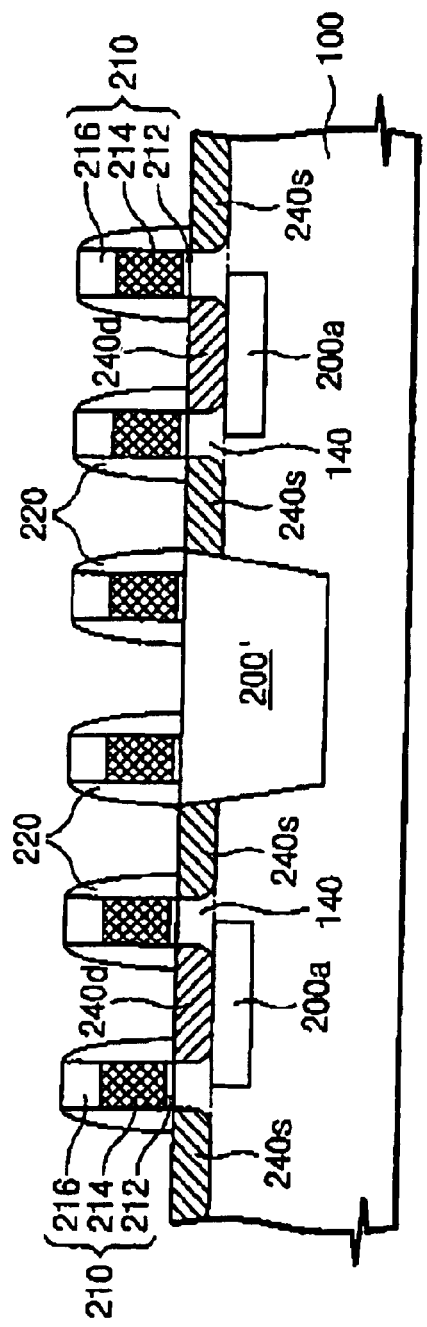
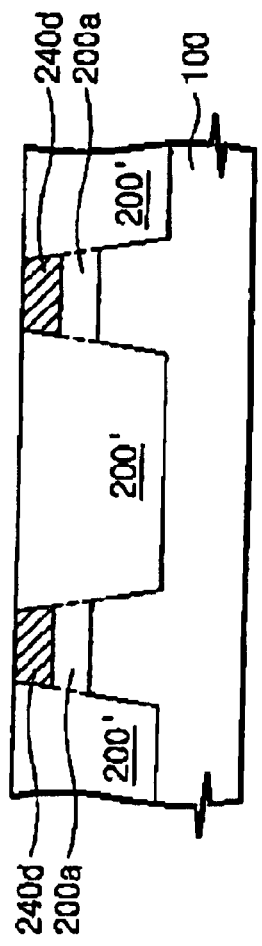

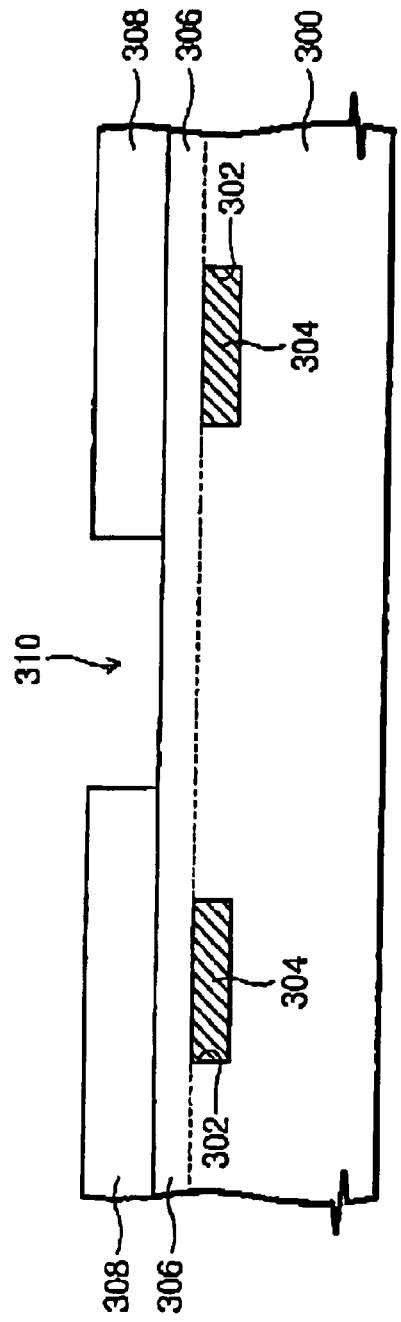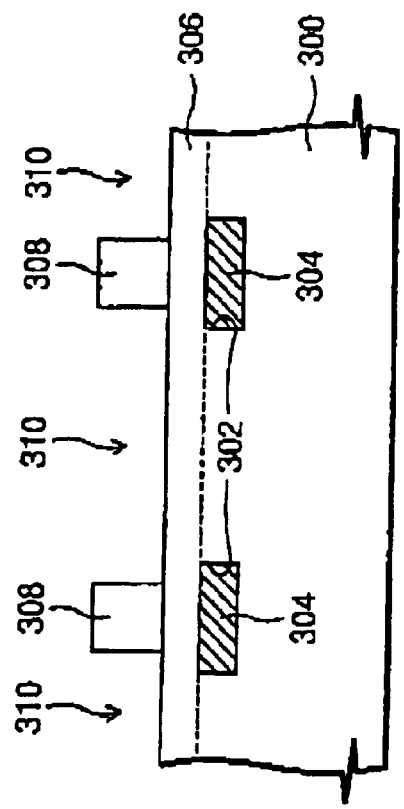

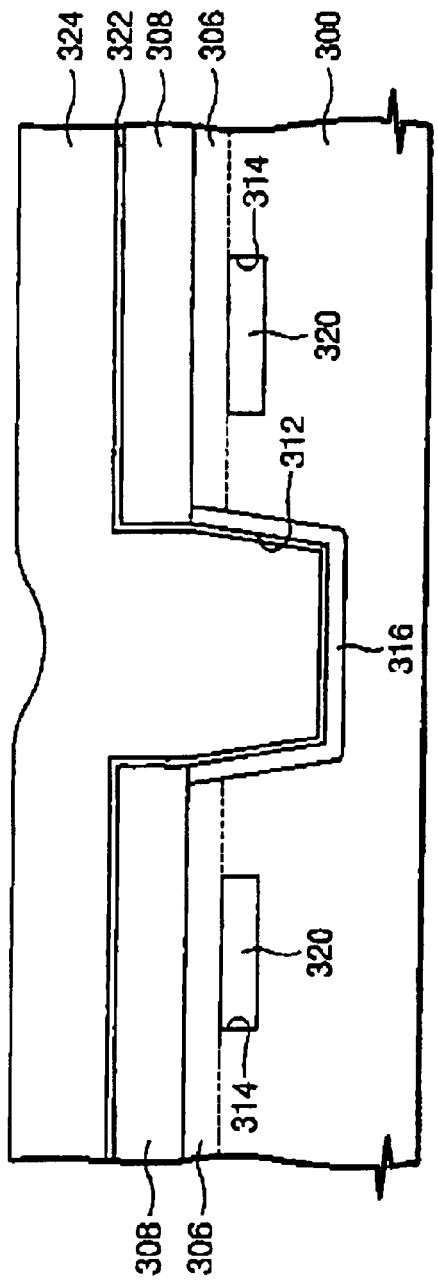
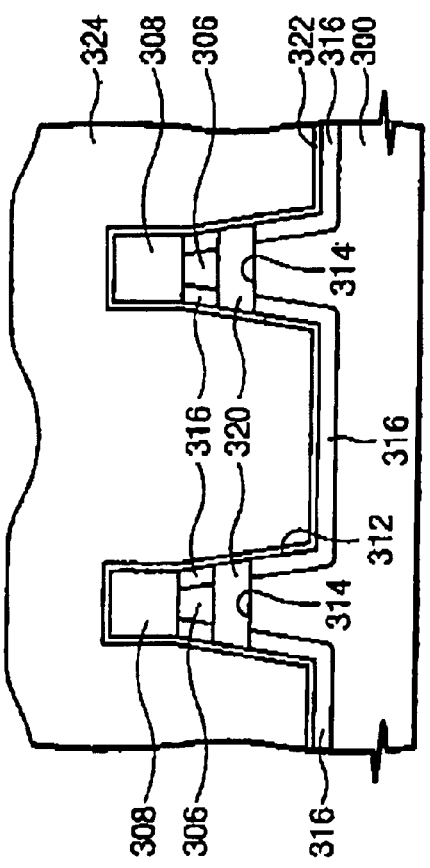

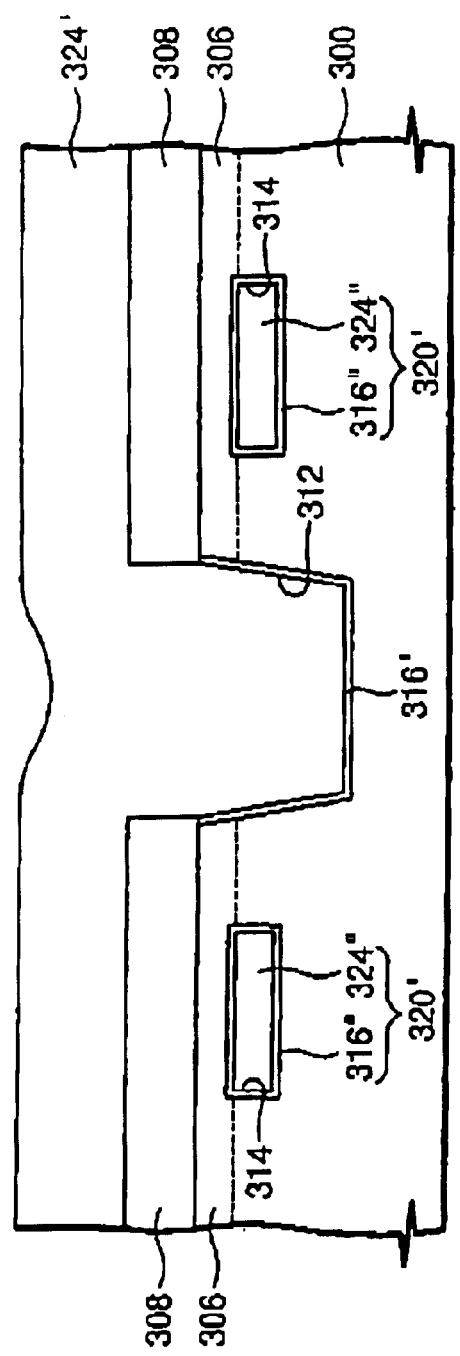
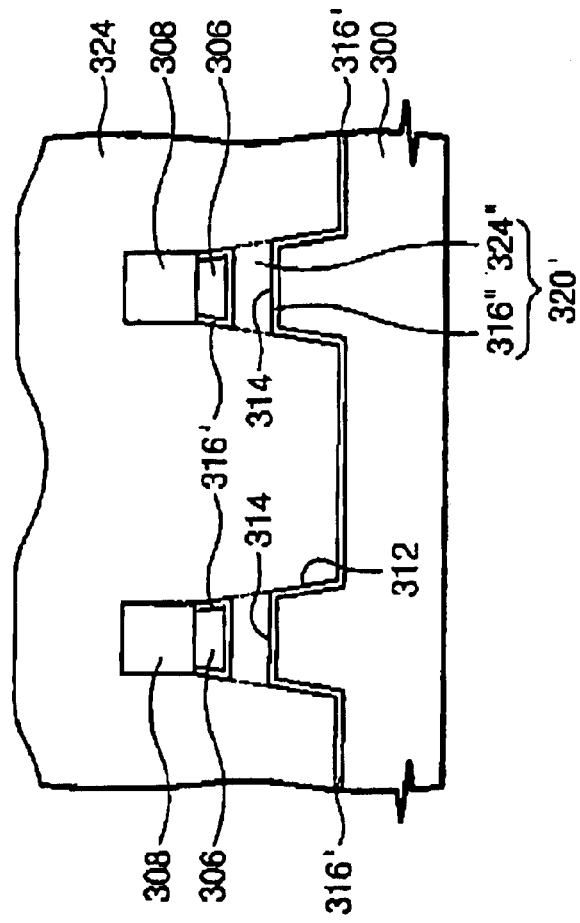
Fig. 12C
Fig. 12D

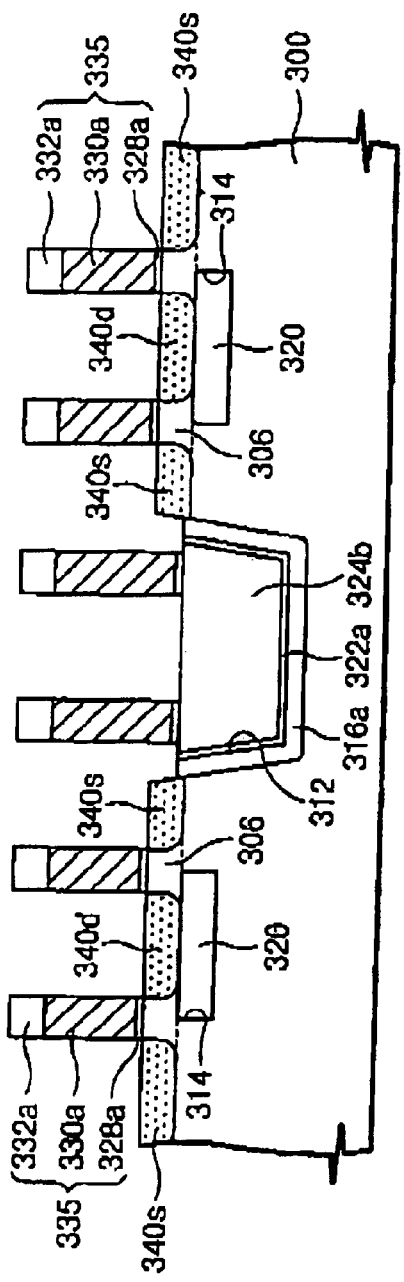
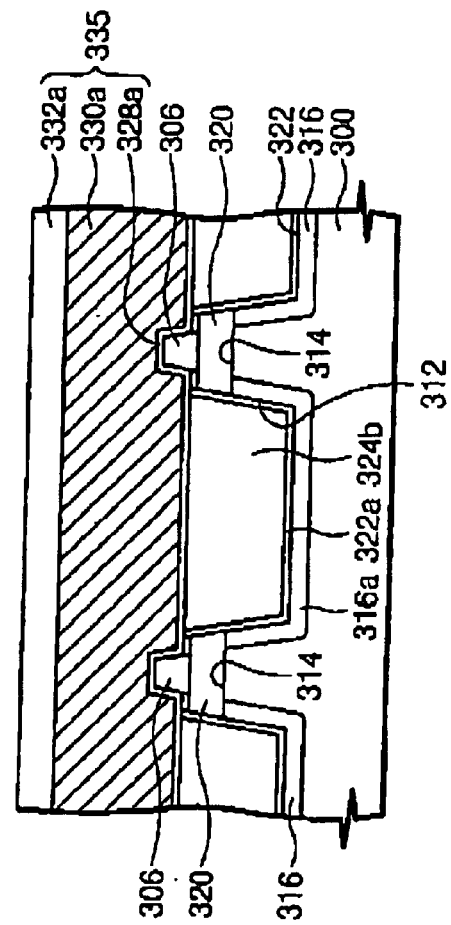
Fig. 15A
Fig. 15B

US 7,081,391 B2

INTEGRATED CIRCUIT DEVICES HAVING BURIED INSULATION LAYERS AND METHODS OF FORMING THE SAME

CLAIM FOR PRIORITY

This application claims priority to Korean Patent Application Nos. 2002-73872 and 2003-41211, filed on Nov. 26, 2002 and Jun. 24, 2003 respectively the contents of which are incorporated herein by reference in their entireties.

FIELD OF THE INVENTION

The present invention generally relates integrated circuit devices and, more specifically, to structures in integrated circuit devices including insulation layers therein and the methods of forming the same.

BACKGROUND

Many integrated circuit devices employ metal-oxide-silicon field-effect transistors (MOSFETs) constructed of gate oxide layers and gate electrodes which are stacked on an integrated circuit substrate and source and drain regions formed in the substrate at both sides of the gate electrodes. The source and drain regions contacts include P/N junctions with the substrate.

Many dynamic random access memories (DRAMs), typically high density memories, include arrays of memory cells each composed of one-MOSFET and one-capacitor. These DRAMs are becoming more highly integrated despite the fact that some physical phenomena that may act as limitations to operational stability of the devices therein.

Exemplary conventional DRAM memory cell arrays are shown in FIGS. 1 and 2. Referring to the plan view of FIG. 1 and the sectional view of FIG. 2 taken along the line I–I' of FIG. 1, field isolation layers 12 are formed in an integrated circuit substrate 10 to define active regions. Gate patterns 20 are arranged on the substrate 10, across the active regions and the field isolation layers 12. The gate patterns 20 are formed of gate oxide layers 14, gate electrodes 16, and hard mask patterns 18. On both sidewalls of the gate patterns 20, gate spacers 22 are formed. Source and drain regions, 24s and 24d, are disposed within the active regions of the substrate 10, between gate patterns 20, forming P/N junctions with the substrate 10.

As devices become more highly integrated, short channel effects and punch-through phenomena may become obstacles to device performance. The short channel and punch-through effects can arise from expansion of depletion regions associated with the P/N junctions formed by the source and drain regions, relative to channel widths, in devices formed with, for example, sub 1 micron gate patterns.

Several techniques have been proposed to overcome short channel effects and punch-through effects, such as a formation of shallow junctions for the source and drain regions and a use of silicon-on-insulator (SOI) substrates. However, the shallow junctions may increase junction leakage currents (although those structures may help reduce the short channel effect). The SOI substrates may contribute to floating body effects, inefficient properties for heat transmission, and high cost productivity (although SOI may reduce the short channel effects, junction leakage currents, and junction capacitance because P/N junctions do not exist under impurity regions).

SUMMARY

Embodiments according to the invention can provide integrated circuit devices including buried insulation layer. Pursuant to these embodiments, an integrated circuit device includes a gate electrode formed on an active region of an integrated circuit device and on a field isolation layer adjacent to the active region. A source region and a drain region are in the active region on alternate sides of the gate electrode. At least one buried insulation layer is beneath the drain region or the source region.

In some embodiments according to the invention, the integrated circuit device further includes a channel silicon layer covering the buried insulation layer in the active region. In some embodiments according to the invention, the channel silicon layer is epitaxially grown single crystalline silicon.

In some embodiments according to the invention, a gate electrode is formed on an active region of an integrated circuit device and on a field isolation layer adjacent to the active region. A source region and a drain region are formed in the active region on alternate sides of the gate electrode. At least one buried insulation layer is formed beneath the drain region or the source region.

In some embodiments according to the invention, a passivation layer is formed in a predetermined region of an integrated circuit substrate. A channel silicon layer is formed on the substrate including the passivation layer. The channel silicon layer and the substrate are patterned to expose sides of the passivation layer and to forming a trench defining an active region. The exposed passivation layer is selectively removed to form a vacant space and a buried insulation layer is formed in the vacant space and forming a field isolation layer in the trench.

BRIEF DESCRIPTION OF THE DRAWINGS

FIGS. 5A through 9A are sectional views illustrating methods of forming a DRAM cell array taken along line II–II' of FIG. 3 according to some embodiments of the invention.

FIGS. 5B through 9B are sectional views illustrating methods of forming a DRAM cell array taken along line III–III' of FIG. 3 according to some embodiments of the invention.

FIGS. 11A through 15A are sectional views illustrating methods of forming a DRAM cell array taken along line IV–IV' of FIG. 10 according to some embodiments of the invention.

FIGS. 11B through 15B are sectional views illustrating methods of forming a DRAM cell array taken along line V–V' of FIG. 10 according to some embodiments of the invention.

FIGS. 12C and 12D are sectional views illustrating methods of forming a DRAM cell array taken along lines IV–IV' and V–V' of FIG. 10 respectively according to some embodiments of the invention.

FIGS. 17A through 20A are sectional views illustrating methods of forming a DRAM cell array taken along line VI–VI' of FIG. 16 according to some embodiments of the invention.

FIGS. 17B through 20B are sectional views illustrating methods of forming a DRAM cell array taken along line VII–VII' of FIG. 16 according to some embodiments of the invention.

DESCRIPTION OF EMBODIMENTS ACCORDING TO THE INVENTION

Figure 1:
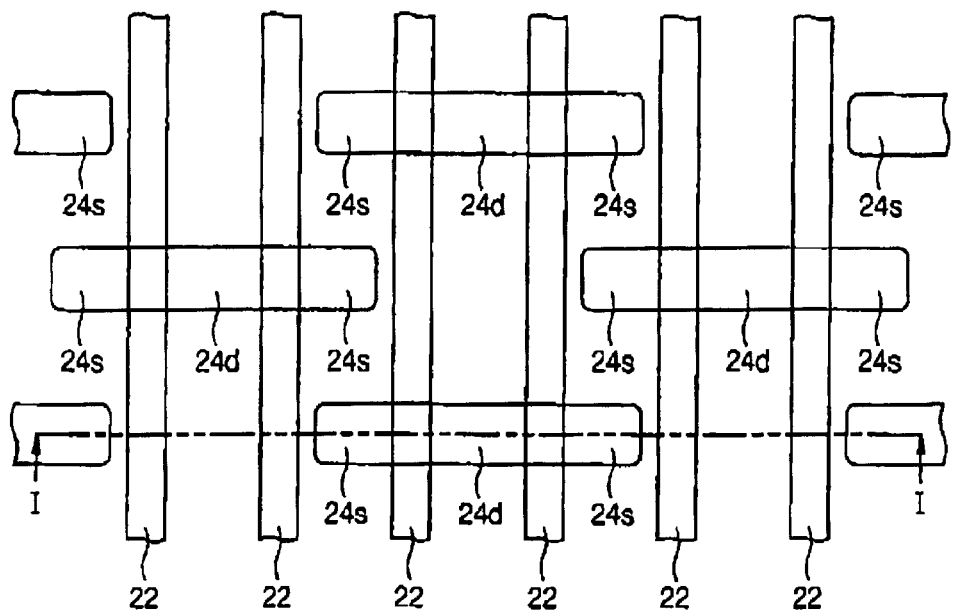
FIG. 1 is a plan view illustrating a conventional DRAM cell array.
Figure 2:
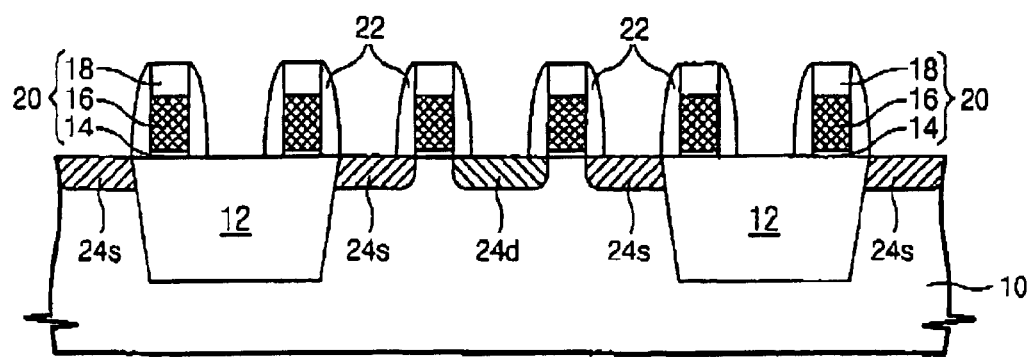
FIG. 2 is a sectional view taken along line I–I' of FIG. 1.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present.

Furthermore, relative terms, such as "lower" and "upper", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompass both an orientation of lower and upper, depending of the particular orientation of the figure.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Figure 3:
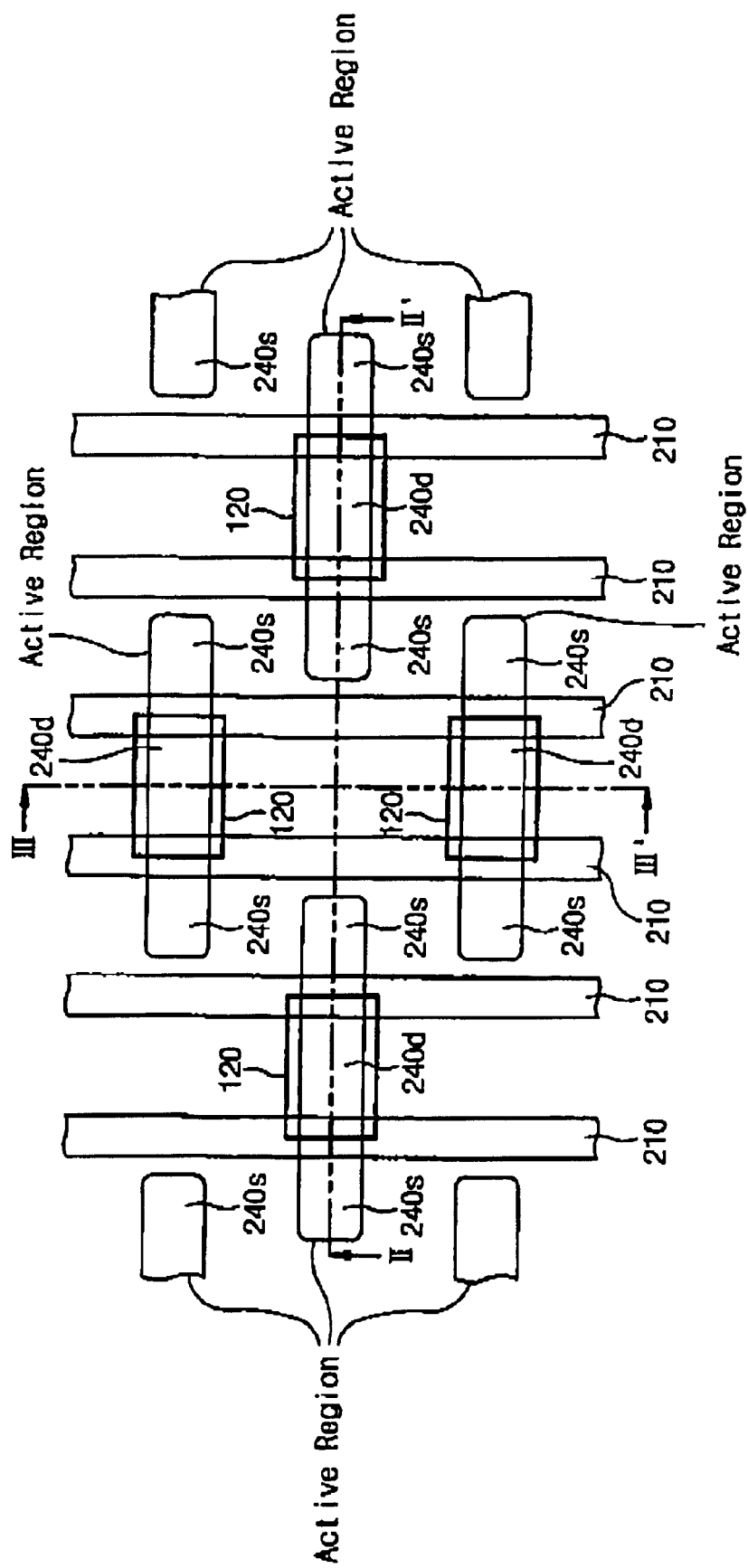
FIG. 3 is a plan view illustrating a DRAM cell array according to some embodiments of the invention.
Figure 4:
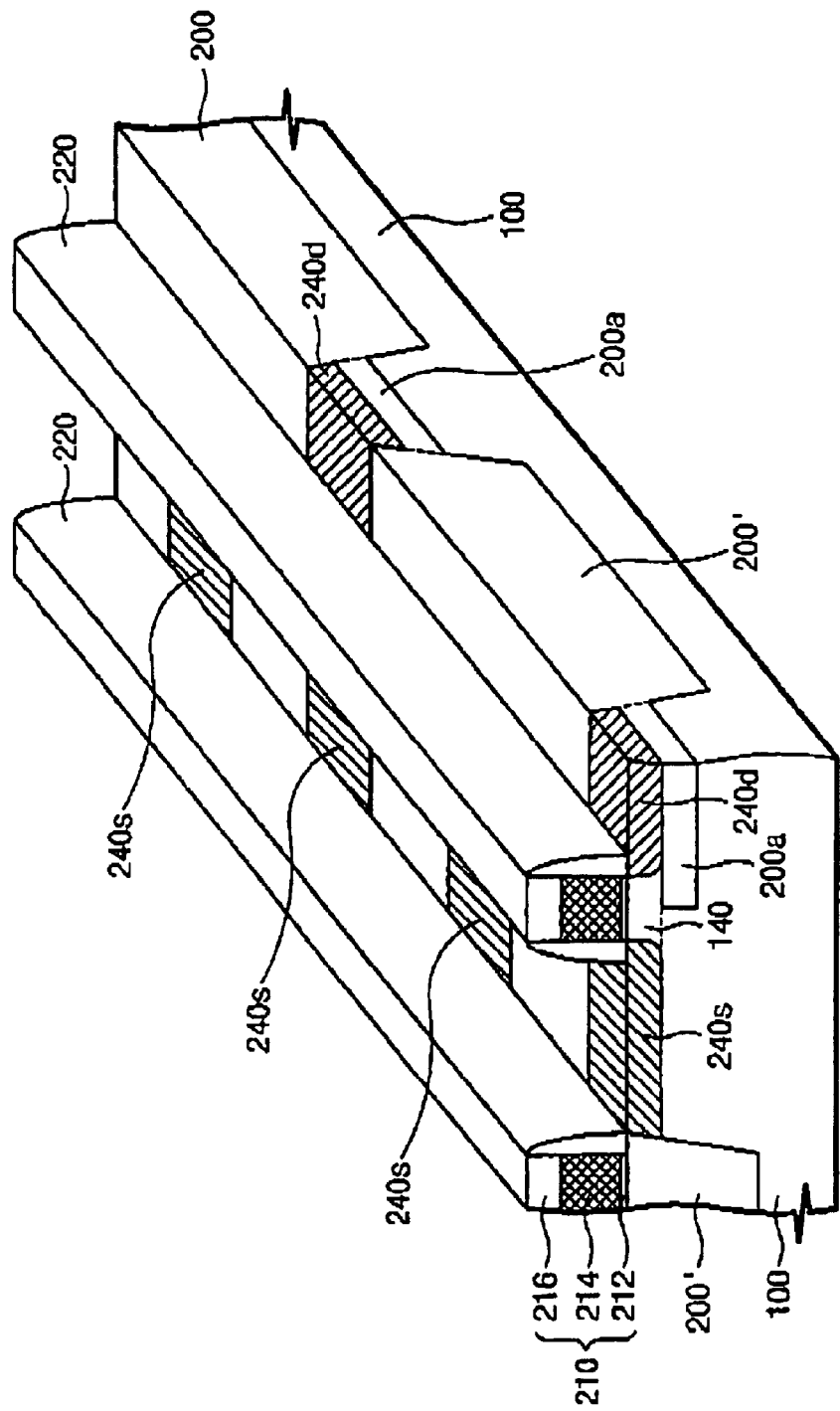
FIG. 4 is a perspective view illustrating a DRAM cell array according to some embodiments of the invention.

FIGS. 3 and 4 show, respectively, a layout pattern (and perspective view) of a partial of a DRAM cell array according to some embodiments of the invention respectively. Referring to FIGS. 3 and 4, field isolation layers 200' are formed in an integrated circuit substrate 100 to define active regions therein. Single crystalline silicon is epitaxially grown at upper positions of the active regions to form channel silicon layers 140. Gate patterns 210 are arranged across the channel silicon layers 140 and the field isolation layers 200'. Each gate layer includes a gate insulation layer 212, a gate electrode 214, and a capping insulation layer 216.

Impurity diffusion regions are formed in the active regions on both sides of the gate patterns 210 to provide source and drain regions 240s and 240d respectively. It is desirable to settle the source and drain regions in the channel silicon layers 140. Buried insulation layers 220a are formed under the drain regions 240d in the substrate 100 at a depth below the channel silicon layers 140. In some embodiments according to the invention, the buried insulation layers 200a may contact the field isolation layers 200'. Furthermore, in some embodiments according to the invention, the buried insulation layers can be formed simultaneous with the field isolation layers 200'. In some embodiments according to the invention, the buried insulation layers 200a may contain vacancies (or voids). In some embodiments according to the invention, the material of the buried insulation layers 200a may be the same as that of the field isolation layers 200'. Spacers 220 are formed on the sidewalls of gate layers 210.

In some embodiments according to the invention, because the buried insulation layers 200a are located deeper in the substrate than the channel silicon layers 140 and under the drain regions 240d, it is possible to reduce the extension of depletion regions generated around the drain regions 240d, which can reduce short channel effects and punch-through phenomena. Moreover, the buried insulation layers 200a may enable the thickness of the channel silicon layers 140 to be increased, which can allow the depth of the source and drain regions, 240s and 240d, to be increased. Such an increase in the depth of the source and drain regions may reduce junction leakage currents. Furthermore, avoiding the use of an SOI substrate may enable the floating body effects discussed above to be avoided while reducing short channel and punch-through effects and reducing manufacturing costs.

FIGS. 5A through 9A illustrate steps of forming a device shown in FIGS. 3 and 4 according to some embodiments of the invention. FIGS. 5A through 9A are taken along line II–II' of FIG. 3 while the sections of FIGS. 5B through 9B are taken along line III–III' of FIG. 3.

Figure 5A:
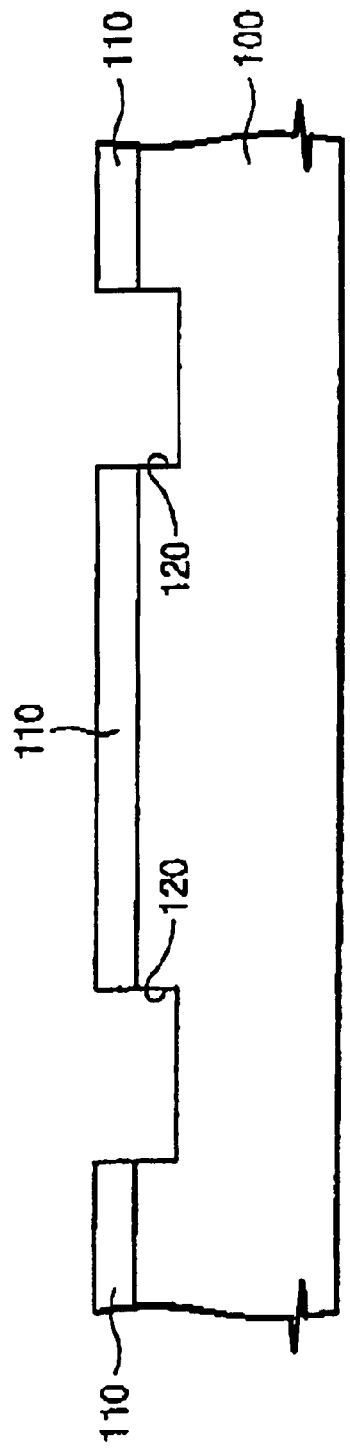
Figure 5B:
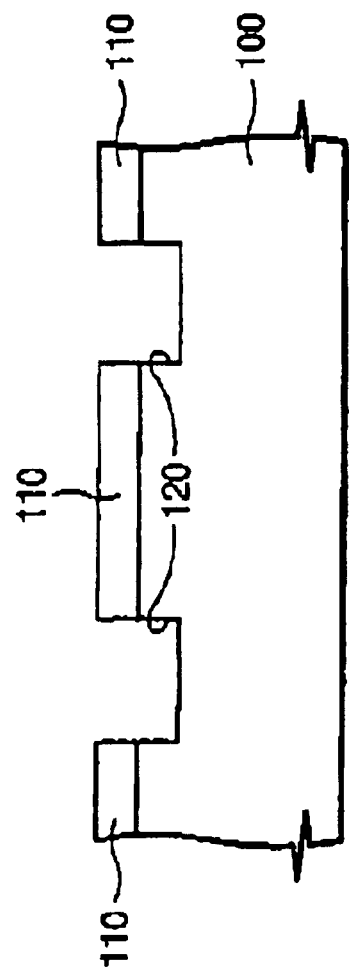

Referring to FIGS. 3, 5A, and 5B, a mask layer 110 is formed on the substrate 100 to expose predetermined regions thereof. An anisotropic etch is performed using the mask layer 110 to form shallow trenches 120 in the substrate 100. The mask layer 110 is made of an insulation material having an etching selectivity relative to the substrate 100. For example, the mask layer 110 can be silicon-oxide or silicon-nitride. The shallow trenches 120 are formed to surround a region of the substrate 100 in which the drain regions 240d will be subsequently formed.

Figure 6A:
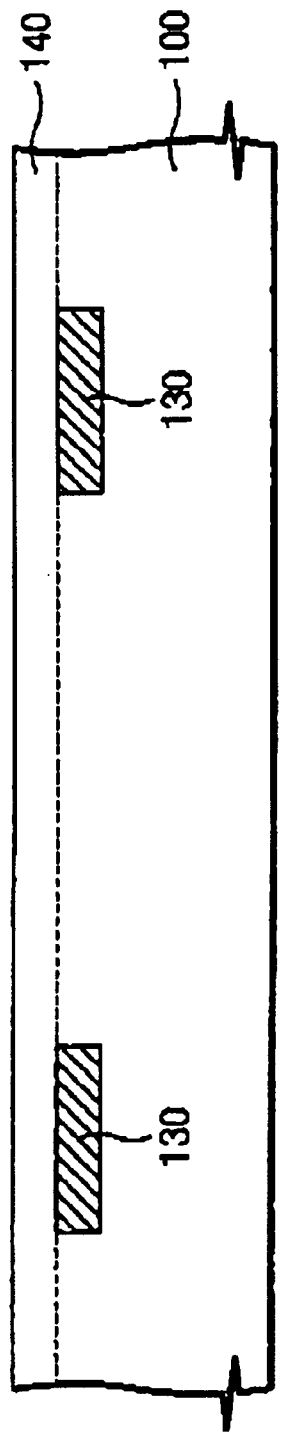
Figure 6B:
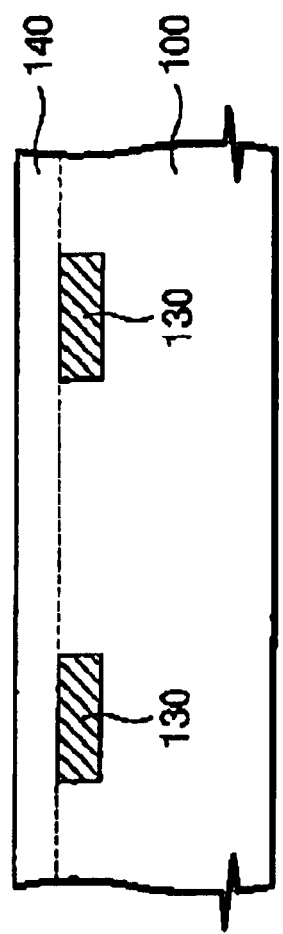

Referring to FIGS. 3, 6A, and 6B, passivation layer 130 is formed to fill the shallow trenches 120. In some embodiments according to the invention, the passivation layer 130 is formed using a material that has an etching selectivity relative to the substrate 100. The passivation layer 130 may be formed by epitaxial growth with a silicon-germanium compound (SiGe) using ultra-high vacuum chemical vapor deposition (UHV-CVD) or low-pressure chemical vapor deposition (LP-CVD). After forming the passivation layer 130, the mask layer 110 is removed to expose a surface of the substrate 100.

A channel silicon layer 140 is deposited on the exposed surface of the substrate 100. The channel silicon layer 140 can provide a region of the active region that functions as a channel of the transistors. In some embodiments according to the invention, the channel silicon layer 140 is formed using a material having an etching selectivity relative to the passivation layers 130, such as single crystalline silicon. The channel silicon layer 140 may be formed by epitaxial growth with single crystalline silicon using ultra-high vacuum chemical vapor deposition (UHV-CVD) or low-pressure chemical vapor deposition (LP-CVD).

It will be understood that the passivation layer 130 is buried under active regions in the substrate 100 in which the drain regions 240d are subsequently formed. The channel silicon layer 140 is deposited on the active regions, covering the substrate 100.

Referring to FIGS. 3, 7A, and 7B, a trench mask layer 150 is provided to expose predetermined regions on the channel silicon layer 140. The channel silicon layer 140 and the substrate 100 are partially etched using the trench mask 150 to form trenches 155 in the substrate 100 to define the active regions therebetween. The trenches 155 include sidewalls that expose portions of the passivation layer 130. That is, sides of the passivation layer 130 are exposed through the openings by the trenches because the etching is carried out until it reaches a predetermined depth into the substrate 100.

The exposed passivation layer 130 is removed to form vacant spaces 155a that extend horizontally into the substrate 100 as shown in FIG. 7B, by which the trenches 155 may be connected to one another. In some embodiments according to the invention, the passivation layer 130 are removed by isotropic dry etching with an etchant having a selectivity relative to the channel silicon layers 140 and the substrate 100, to reduce damage. In some embodiments according to the invention, the etching is performed using a wet etch.

Referring to FIGS. 8A, 8B and FIG. 3, a field isolation layer 200 is deposited on the substrate 100 (including the vacant spaces 155a from which the passivation layer 130 were removed) to fill the trenches 155. The field isolation layer 200 that fill the vacant spaces 155a conforms to the buried insulation layers 200a so that the buried insulation layers 200a can be formed of the same material (and at the same time) with the field isolation layer 200. In some embodiments according to the invention, the field isolation layer 200 is formed of silicon oxide by CVD or a spin coating process. For example, in some embodiments according to the invention, the field isolation layer 200/buried insulation layers 200a is formed of at least one of the following materials: a high density plasma (HDP) oxide, a undoped silicate glass (USG), and a spin-on-glass (SOG) series material to reduce the occurrence of vacancies in therein.

In some embodiments, according to the invention, thermal oxidation can be performed to form sidewall oxide layers (not shown) in the vacant spaces 155a before depositing the field isolation layer 200. The sidewall oxidation may reduce damage caused by the etching used to form the trenches 155 and the vacant spaces 155a. In some embodiments according to the invention, a liner of, for example a silicon-nitride, can be formed to cover the surfaces of the trenches 155 and the vacant spaces 155a.

In some embodiments according to the invention, the buried insulation layers 200a and the field isolation layer 200 are formed sequentially. For example, a thermal oxidation can be performed on the substrate 100 (including the vacant spaces 200a) to form the buried insulation layers 200a in the vacant spaces 200a, thereby forming the buried insulation layers 200a of thermal oxide layers. Accordingly, sidewall oxide layers may also be by formed on sidewalls and bottoms of the trenches 155 and the field isolation layer 200 is formed to fill the trenches 155. In some embodiments according to the invention, a liner (not shown) is formed before depositing the field isolation later 200.

Referring to FIGS. 3, 9A, and 9B, the field isolation layer 200 is planarized by etching until the trench mask layer 150 is exposed to form the patterned field isolation layers 200'. The trench mask layer 150 is removed to expose the top of the channel silicon layers 140. A gate insulation layer, a conductive gate layer, and a capping insulation layer are sequentially deposited on the exposed channel silicon layer 140. In some embodiments according to the invention, the gate insulation layer is formed of a silicon oxide layer by thermally oxidizing the exposed top of the channel silicon layers 140. In some embodiments according to the invention, the conductive gate layer is formed of a conductive material containing polycrystalline silicon. In some embodiments according to the invention, the capping insulation layer is formed of a dielectric (or insulation) material, such as silicon-nitride or silicon-oxide-nitride, which can be used as a reflection protecting layer or a hard mask layer.

The capping insulation layer, the conductive gate layer, and the gate insulation layer are patterned to predetermined configurations, so that the patterned layers becomes the gate insulation layers 212, the gate electrodes 214, and the capping insulation layers 216, arranged across the field isolation layer 200', to provide the gate layers 210.

The gate layers 210 are used as a mask layer during an ion implantation to form the impurity diffusion regions for the source and drain regions 240s and 240d respectively. The drain regions 240d are formed above the buried insulation layers 200a to reduce short channel and punch-through effects by reducing/preventing the expansion of depletion regions around the drain regions 240d.

Figure 10:
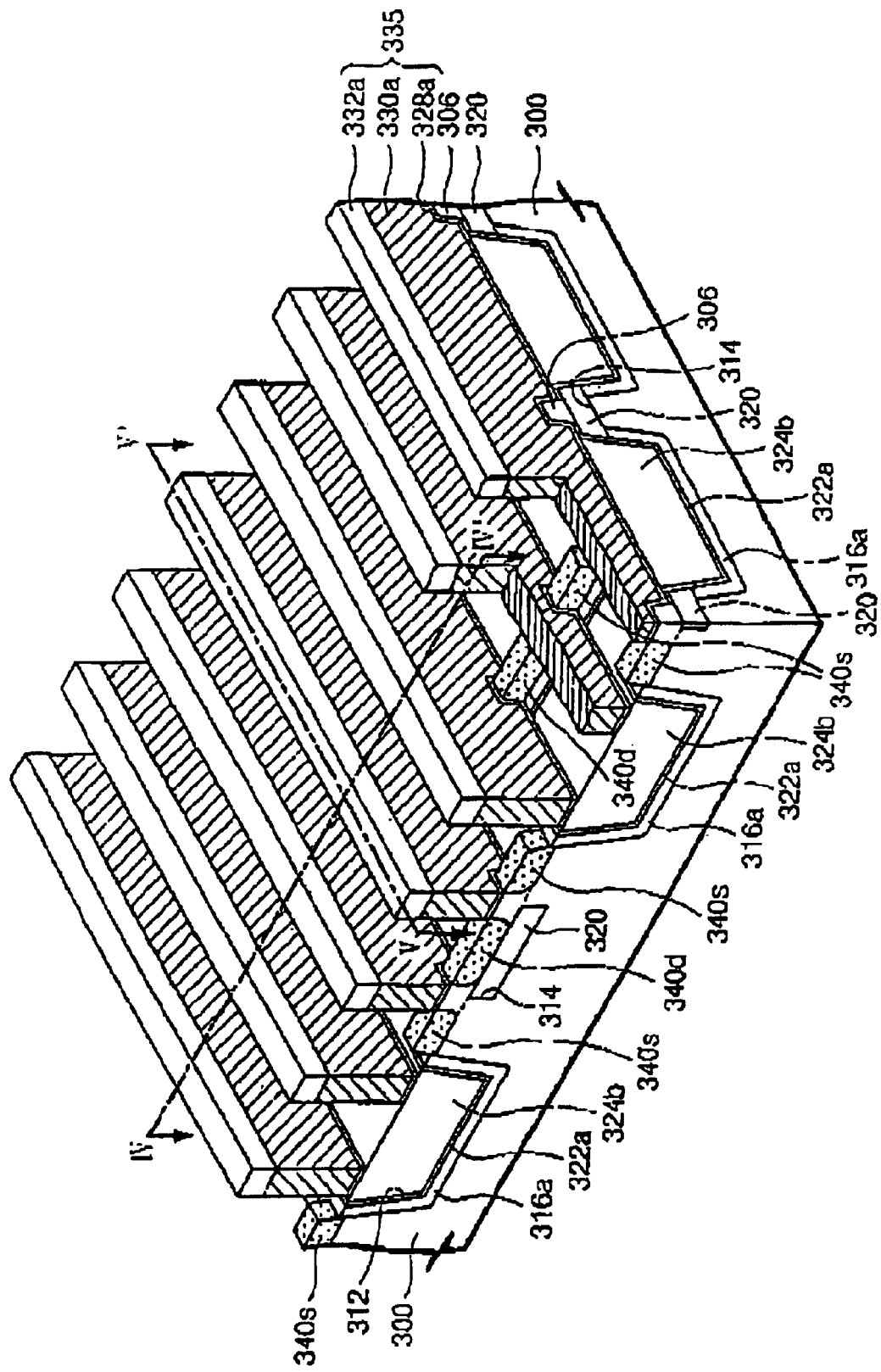
FIG. 10 is a perspective view illustrating a DRAM cell array according to some embodiments of the invention.
Figure 13A:
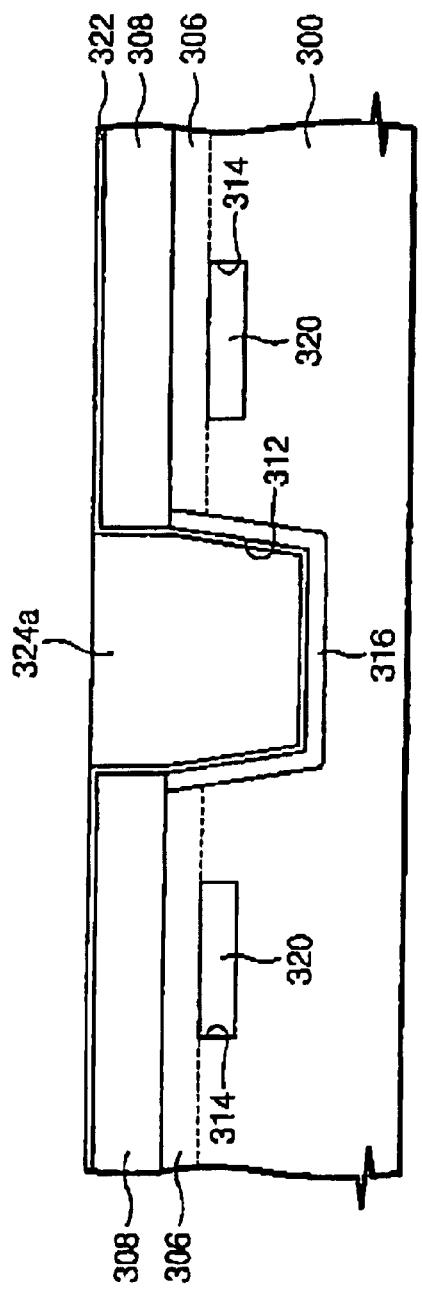
Figure 13B:
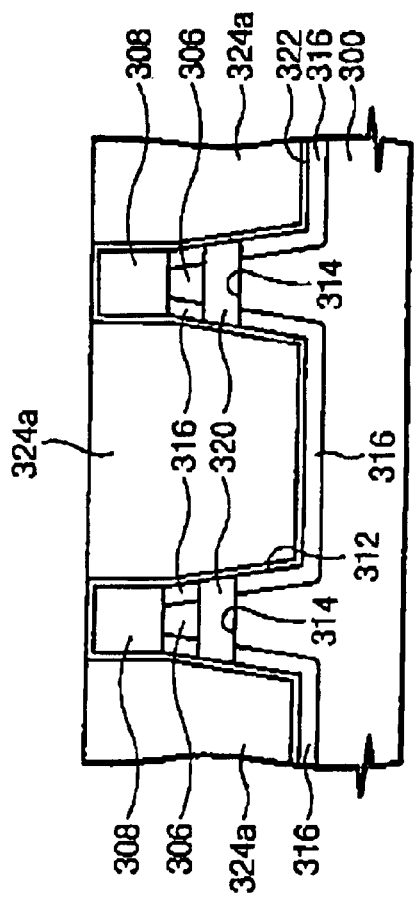
Figure 14A:
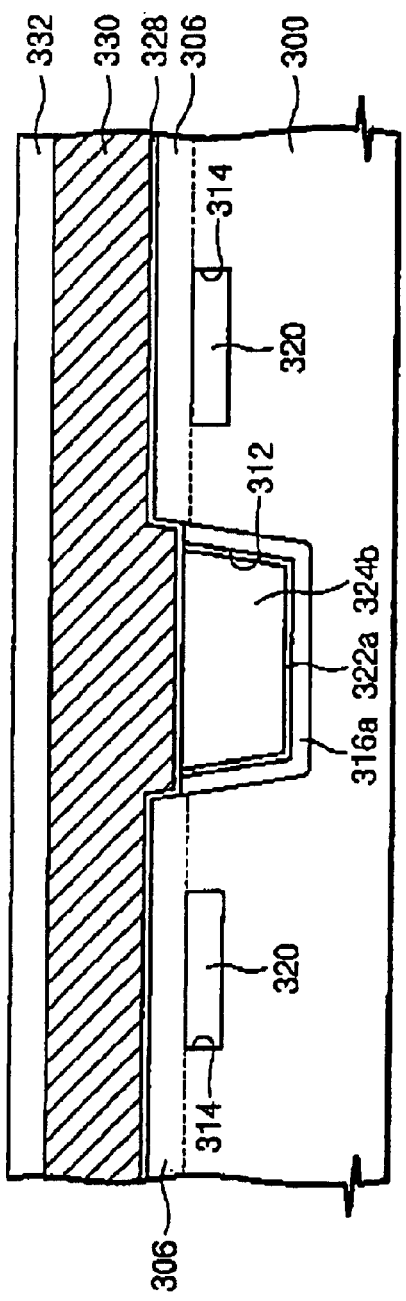
Figure 14B:
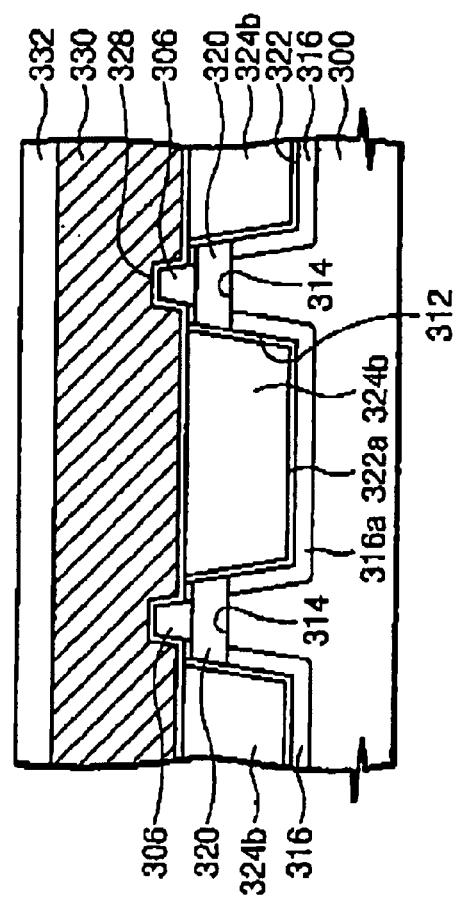

In other embodiments according to the invention, a duplicate gate structure and a buried insulation layer are provided to control the channel more closely and, therefore, reduce punch-through and short channel effects. A partial perspective view of an integrated circuit device including a duplicate gate structure and a buried insulating layer according to some embodiments of the invention is shown in FIG. 10. In particular, channel silicon layers 306 are disposed in an integrated circuit substrate 300. The channel silicon layers 306 can be formed of single crystalline silicon formed by means of the epitaxial growth. The channel silicon layers 306 and the substrate 300 are sequentially patterned to form trenches 312, which define active regions therebetween.

Field isolation layers 324a' are formed in the trenches 312. In some embodiments according to the invention, the tops of the field isolation layers 324b are lower than the channel silicon layers 306, so that the top sides of the active regions are exposed. The exposed portions of the active regions may include the channel silicon layers 306 and parts of the substrate 300. Sidewall oxide layers 316 are deposited on sidewalls and bottoms of the trenches 312 and the field isolation layers 324a' are deposited thereon. In some embodiments according to the invention, liner layers 322a can be formed between the sidewall oxide layers 316 and the field isolation layers 324b. The field isolation layers 324b may be formed of silicon oxides and the sidewall oxide layers 316 can be formed of thermal oxides. The liner layers 322a may be formed of silicon-nitride or silicon-oxide-nitride.

Gate layers 335 are formed across the active regions and the field isolation layers 324b. The gate layers 335 are arranged on the top and sides of the active regions (i.e., the channel) to provide a duplicate structure to control the channel regions from opposite sides. Such a duplicate gate structure may further reduce the short channel and punch-through effects. Furthermore, the effective channel width may be increased to increase the amount of on-current.

In some embodiments according to the invention, the gate layers 335 include gate insulation layer 328a, a gate electrode 330a, and a capping insulation layer 332a. In some embodiments according to the invention, the gate insulation layer 328a is formed of a silicon oxide layer, such as a thermal oxide layer. In some embodiments according to the invention, the gate electrode 330a is formed of a conductive material, such as a doped polycrystalline layer. The gate electrode 330a may further include a metal silicide layer formed on the doped polycrystalline layer. In some embodiments according to the invention, the capping insulation layer 332a is formed of a silicon-nitride layer or a silicon-oxide-nitride layer.

Impurity diffusion layers are formed in the active regions on both sides of the gate layers 335 to provide source and drain regions 340s and 340d. In some embodiments according to the invention, the source and drain regions 340s and 340d are formed within the channel silicon layer 306. In some embodiments according to the invention, the drain regions 340d are shared by adjacent transistors.

Buried insulation layers 320 are formed under the channel silicon layers 306, contacting the bottoms of the drain regions 340d. In some embodiments according to the invention, the buried insulation layer 320 is formed of a thermal oxide. In some embodiments according to the invention, the buried insulation layer 320 is made of the same material that forms the sidewall oxide layer 316. That is, the buried insulation layers 320 may be constructed together with the sidewall oxide layers 316.

In some embodiments according to the invention, the buried insulation layer 320 may contain the same material as the field isolation layers 324b. In some embodiments according to the invention, the buried insulation layer 320 and the field isolation layers 324b are formed of evaporated or coated insulation layers. Although not shown, the buried insulation layers 320 may be formed of the same material as the liner layer 322a. The buried insulation layers 320 may also contain vacancies therein.

It is possible to reduce the extension of depletion regions around the drain regions 340d by placing the buried insulation layers 320 under the channel silicon layers 306, and specifically under the drain regions 340d. This placement may effectively reduce short channel and punch-through phenomena. Moreover, the duplicate gate structure defined by the exposed top and sides of the active regions may be more efficient and, thereby reduce the short channel and punch-through effects. In addition, it may be possible to provide an integrated circuit device that is less susceptible to short channel and punch-through effects while being less expensive to manufacture by avoiding the use of an expensive SOI substrate.

Now, FIGS. 11A through 15B illustrate steps of forming a device shown in FIG. 10 according to some embodiments of the invention. The sections FIGS. 11A through 15A are taken along line IV–IV' of FIG. 10 while the sections FIGS. 11B through 15B are taken along line V–V' of FIG. 10. Specifically, FIGS. 12C and 12D are sectional views illustrating methods of forming buried insulation layers in the device shown in FIG. 10 according to some embodiments of the invention, each taken along lines IV–IV' and V–V' of FIG. 10.

Referring to FIGS. 11A and 11B, a mask (not shown) is used to expose predetermined regions of the integrated circuit substrate 300. An anisotropic etching is carried out using the mask to form shallow trenches 302 in the substrate 300. A passivation layer 304 is formed to fill the shallow trenches 302. In some embodiments according to the invention, the passivation layer 302 is formed of a material that has an etch selectivity relative to the silicon substrate 300. In some embodiments according to the invention, the passivation layers 304 is formed by means of epitaxial growth with silicon-germanium compound (SiGe) using an ultra-high vacuum chemical vapor deposition (UHV-CVD) or low-pressure chemical vapor deposition (LP-CVD). During the epixatial growth, the mask layer acts as a growth protection layer to enable the passivation layers 304 to be selectively formed in the shallow trenches 302. The etching selectivity may be enhanced by increasing the concentration of germanium in the SiGe compound. The processes of forming the shallow trenches 302 and the passivation layers 304 can be carried out in the same manner as used for the shallow trenches 120 and the passivation layers 130 as discussed above in reference to FIGS. 5A and 6A.

The mask layer is removed and the channel silicon layer 306 is deposited on the substrate 300 to cover the passivation layers 304. The channel silicon layer 306 is formed of a material, such as single crystalline silicon, by epitaxial growth using ultra-high vacuum chemical vapor deposition (UHV-CVD) or low-pressure chemical vapor deposition (LP-CVD).

A trench mask layer 308 including openings 310 is formed on the channel silicon layer 306 deposited in the substrate 300 to expose predetermined regions. In some embodiments according to the invention, the trench mask layer 308 is made of a material having an etching selectivity relative to the channel silicon layer 306 and the substrate 300, such as silicon-nitride or silicon-oxide-nitride.

Referring to FIGS. 12A and 12B, the channel silicon layer 306 and the substrate 300 are partially etched away using the trench mask layer 308 so that the trenches 312 are formed in the substrate 100 to define the active regions. The trenches 312 expose partial sides of the passivation layers 304. That is, the sides of the passivation layers 304 are exposed in the trenches when the etching reaches a predetermined depth into the substrate 300.

The exposed passivation layer 304 is selectively removed to form vacant spaces 314 through which the trenches 312 are connected to one another. The passivation layer 304 is removed using an etchant having a selectivity relative to the channel silicon layers 306 and the substrate 300. In some embodiments according to the invention, the passivation layer 304 is removed by an isotropic dry etching to reduce damage. In some embodiments according to the invention, the passivation layer 304 is removed by wet etching.

Referring to FIGS. 12A and 12B, buried insulation layers 320 are formed in the vacant spaces 314 and in the trenches 312 to form the field isolation layers 324. The buried insulation layers 320 and the field isolation layers 324 may be deposited separately. In some embodiments according to the invention, the buried insulation layers 320 are formed of a thermal oxide layer generated by thermal oxidation to the substrate 300 containing the vacant spaces 314. Sidewall oxide layers 316 are formed on the bottoms and sides of the trenches 312. The thermal oxidation may reduce abrasions and other damage to the top and sides of the trenches 312 and the inner surfaces of the vacant spaces 314 caused by the etching steps.

A liner layer 322 of silicon-nitride is formed in the trench 312 and the field isolation layer 324 of silicon-oxide is deposited on the liner layers 322 to fill the trench 312. In some embodiments according to the invention, the trench mask layer 308 is removed before forming the liner layer 322 to reduce the ratio of length to the width of the trench 312. In some embodiments according to the invention, the buried insulation layers 320 and the field isolation layers 324 are formed simultaneously as shown in FIGS. 12C and 12D. In such embodiments according to the invention, the buried insulation layer 320 and the field isolation layers 324 are formed of the same material.

Referring to FIGS. 12C and 12D, a field isolation layer 324' is formed on the substrate 300 to fill the vacant spaces 314 and the trenches 312. The portions of the field isolation layer 324' that fill the vacant spaces 314 correspond to the buried insulation layers 320'. In some embodiments according to the invention, the field isolation layer 324' is a material having excellent step coverage, such as SOG In some embodiments according to the invention, the field isolation layer 324' is formed by HVCVD or LPCVD. In some embodiments according to the invention, a thermal oxidation process is performed before depositing the field isolation layer 324' to form sidewall oxide layers 316' on the sides and bottoms of the trenches 312 and to form thermal oxide layers 316" on the inner surfaces of the vacant spaces 314 for inclusion into the buried insulation layers 320'. Although not shown in FIGS. 12C and 12D, in some embodiments according to the invention, a liner layer is formed before depositing the field isolation layer 324' so that the buried insulation layers 320' includes the same material as the liner layer.

Referring to FIGS. 13A, 13B, 14A, and 14B, the field isolation layer 324' is planarized by etching until the liner layer 322 is exposed to form patterned field isolation layers 324a that fill the trenches 312. The field isolation layers 324a are recessed into the trenches 312 until the liner layer 322a is exposed at the topside levels of the active regions to form recessed field isolation layers 324b in the trenches 312. The top surfaces of the recessed field isolation layers 324b are lower than the top surfaces of the channel silicon layers 306 and higher than the top surfaces of the buried insulation layers 320.

The exposed portions of the liner layer 322, the trench mask layer 308, and sidewall oxide layer 316, are removed so that the top surfaces of the active regions (including the channel silicon layers 306) protrude from the recessed surfaces. Also, the protruding portions of the active regions may include parts of the substrate 300. In some embodiments according to the invention, an isotropic etch is used to shape the protruding active regions.

A gate insulation layer 328, a conductive gate layer 330, and a capping insulation layer 332 are deposited on the substrate 300. In some embodiments according to the invention, the gate insulation layer 328 is formed of a silicon oxide layer, such as a thermal oxide layer. In some embodiments according to the invention, the conductive gate layer 330 includes doped polycrystalline silicon that is planarized. In some embodiments according to the invention, the conductive gate layer 330 includes a metal silicide layer formed on the doped polycrystalline silicon layer. In some embodiments according to the invention, the capping insulation layer 332 is a dielectric (or insulation) material, such as silicon-nitride or silicon-oxide-nitride, that can provide a reflection protecting layer or a hard mask layer.

Referring to FIGS. 15A and 15B, the capping insulation layer 332, the conductive gate layer 330, and the gate insulation layer 328 are patterned to form gate layers 335 that include the gate insulation layers 328a, the gate electrodes 330a, and the capping insulation layers 332a. The gate layers 335 are arranged across the exposed top surfaces of the active regions. The gate layers 335 are used as mask layers for an ion implantation to form the impurity diffusion regions that make up the source and drain regions 340s and 340d respectively. The source and drain regions 340s and 340d are disposed within the channel silicon layers 306 and on the buried insulation layers 200a, which can reduce expansion of depletion regions around the drain regions to reduce short channel and punch-through effects because it.

In some embodiments according to the invention, gate spacers are formed on both sides of the gate layers 335.

Figure 16:
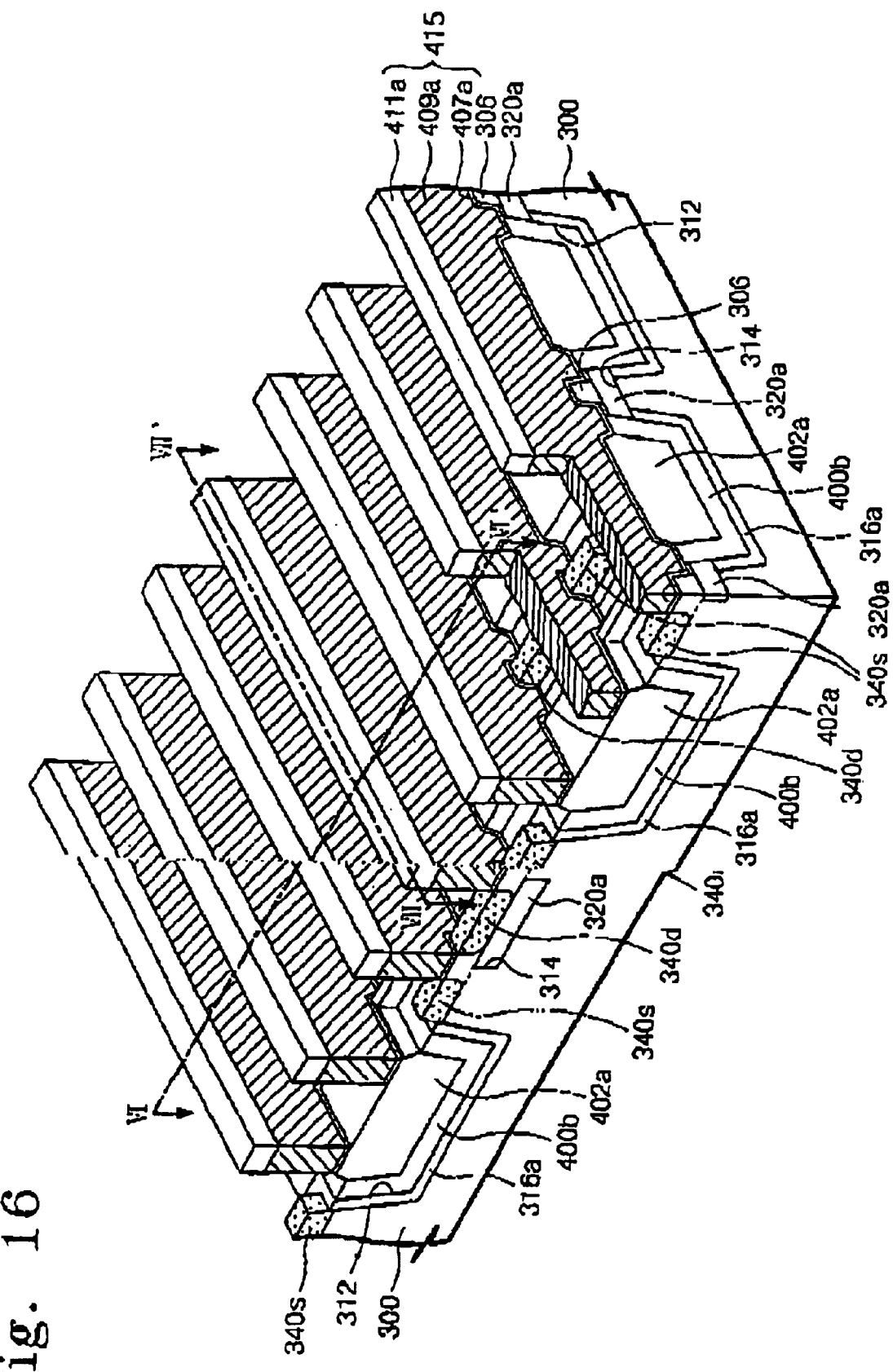
FIG. 16 is a perspective view illustrating a DRAM cell array according to some embodiments of the invention.

FIG. 16 is a perspective view of a partial structure of the DRAM cell array according to some embodiments of the invention. Referring to FIG. 16, the channel silicon layers 306 are disposed in the integrated circuit substrate 300. In some embodiments according to the invention, the channel silicon layers 306 are formed of single crystalline silicon using epitaxial growth. The channel silicon layers 306 and the substrate 300 are sequentially patterned to form trenches 312. The trenches 312 define active regions, containing field isolation layers 402a therein.

Liner layers 400b are formed in the trenches 312 between the field isolation layers 402a (on the bottoms and sides of the trenches 312). Top surfaces of the liner layers 400b are recessed to be lower than the top surfaces of the active regions, thereby forming grooves 405 between the top surfaces of the active regions and the top surfaces of the field isolation layers 402a. That is, the grooves 405 expose both topsides of the active regions. In some embodiments according to the invention, the liner layers 400b are formed to be thicker than those (322a) shown in FIG. 10.

Gate layers 415 are formed across the active regions and the field isolation layers 402a. The gate layers 415 are formed of gate insulation layer 407a, gate electrodes 409a, and capping insulation layers 411a. The gate insulation layers 407a are conformally deposited in the grooves 405. The gate electrodes 409a are deposited to extend into and fill the grooves 405. As shown in FIG. 16, the gate electrodes 409a form a duplicate structure, crossing the tops and sides of the active regions (including the channel silicon layers 306). The duplicate gate structure can control the channel regions (defined by the exposed top and side surfaces of the active regions) more efficiently to thereby reduce short channel and punch-through effects.

In some embodiments according to the invention, the liner layers 400b are insulation layers having an etch selectivity relative to the field isolation layers 402a. In some embodiments according to the invention, the liner layers 400b are formed of a material having an etch selectivity relative to the channel silicon layers 306 or the substrate 300. For example, the liner layers 400b can be formed of silicon-nitride or silicon-oxide-nitride.

Sidewall oxide layers 316 are deposited on the bottoms and sides of the trenches 312 so that top surfaces of the sidewall oxide layers 316 form the bottoms of the grooves 405. That is, inner sidewalls of the grooves 405 are defined by the exposed sides of the active regions and the top surfaces of the field isolation layers 402a, and the bottoms of the grooves 405 are defined by the sidewall oxide layers 316 and the liner layers 400b. The sidewall oxide layers 316 may be formed of thermal oxides. Impurity diffusion layers are formed in the active regions on both sides of the gate layers 415. The impurity diffusion layers provide source and drain regions 420s and 420d respectively. The source and drain regions 420s and 420d are located within the channel silicon layers 306.

Buried insulation layers 320a are formed under the channel silicon layers 306, contacting the bottoms of the drain regions 340d. In some embodiments according to the invention, the buried insulation layers 320a are formed of thermal oxides. In some embodiments according to the invention, the buried insulation layers 320a are formed of the same material as the sidewall oxide layers 316. In some embodiments according to the invention, the buried insulation layers 320a may contain vacancies (or voids) therein.

The buried insulation layers 320a under the channel silicon layers 306 and under the drain regions 420d, can reduce the extension of depletion regions around the drain regions 420d. The buried insulation layers 320a can also reduce short channel effects and punch-through phenomena. Moreover, the duplicate gate structure which is configured to control the channel regions defined with the exposed top and sides of the active regions may provide for more efficient control of the channel to reduce the short channel effects and punch-through phenomenon. In addition, by avoiding the use of an SOI substrate, an integrated circuit device according to some embodiments of the invention may have increased resistance to short channel effects and punch-through effects at a lower manufacturing cost.

FIGS. 17A through 20B illustrate steps of forming a device shown in FIG. 16 according to some embodiments of the invention. The sections in FIGS. 17A through 20A are taken along line VI–VI' of FIG. 16 while the sections FIGS. 17B through 20B are taken along line VII–VII' of FIG. 16.

Figure 17A:
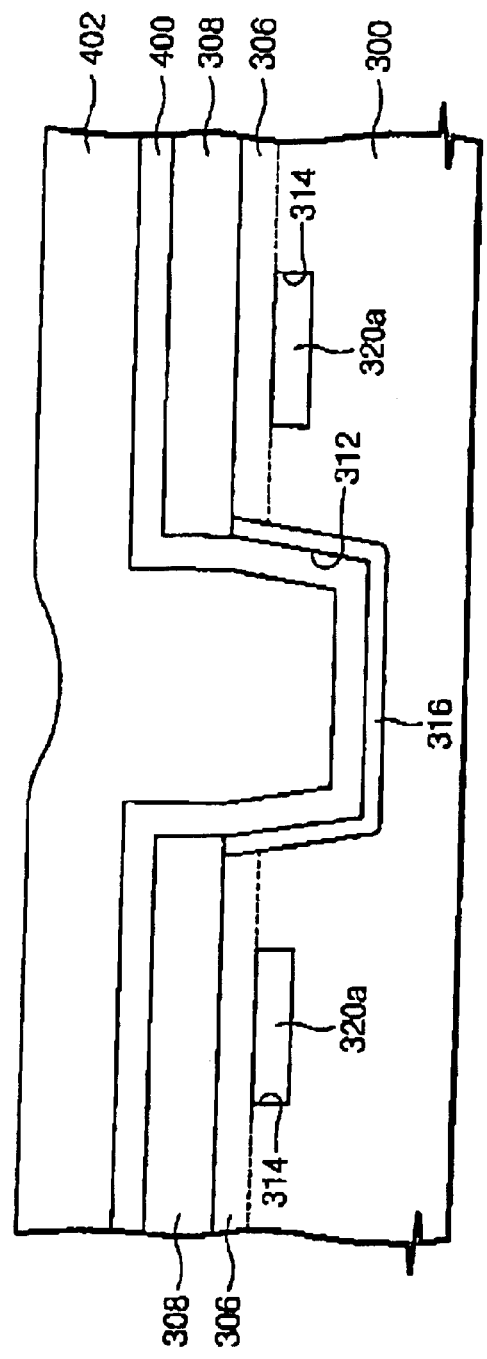
Figure 17B:
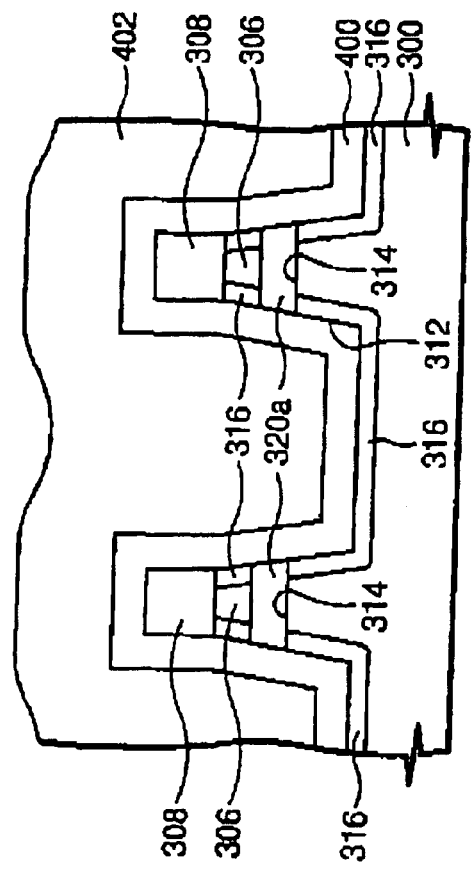
Figure 18A:
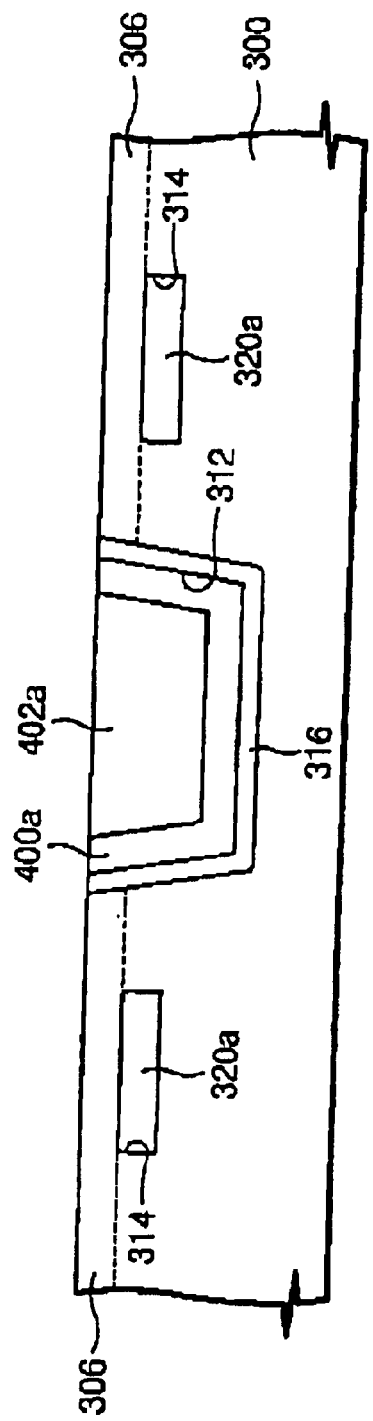
Figure 18B:
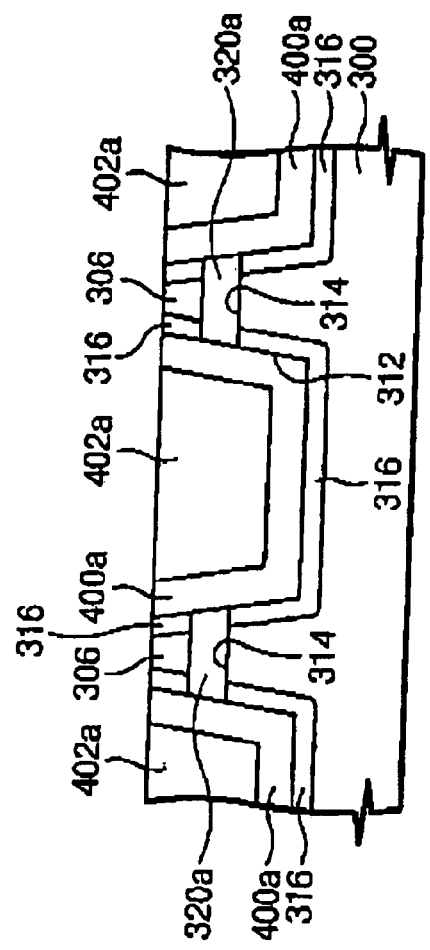
Figure 19A:
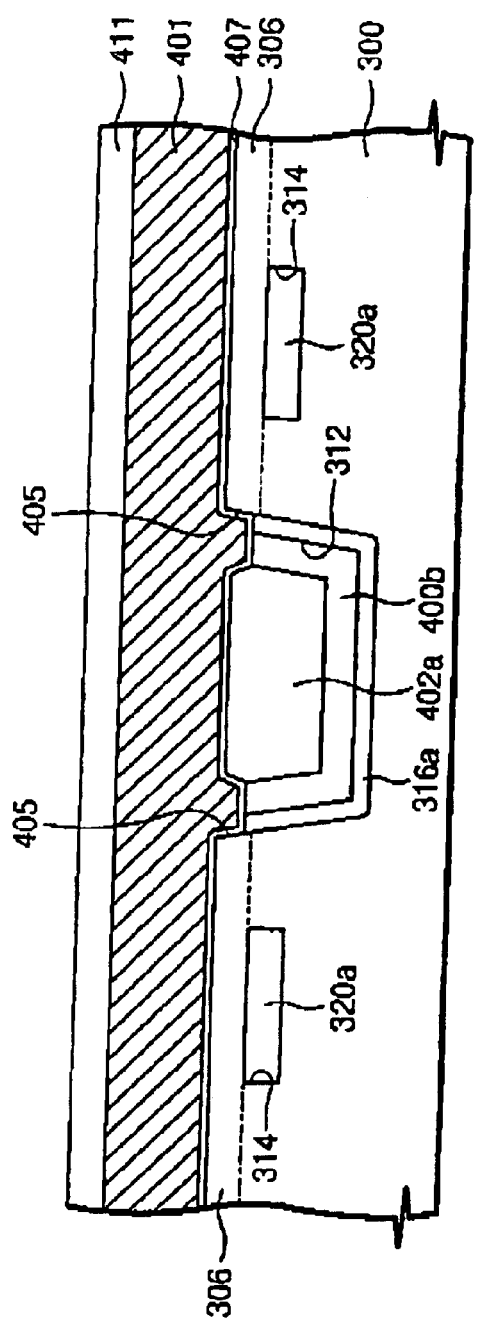
Figure 19B:
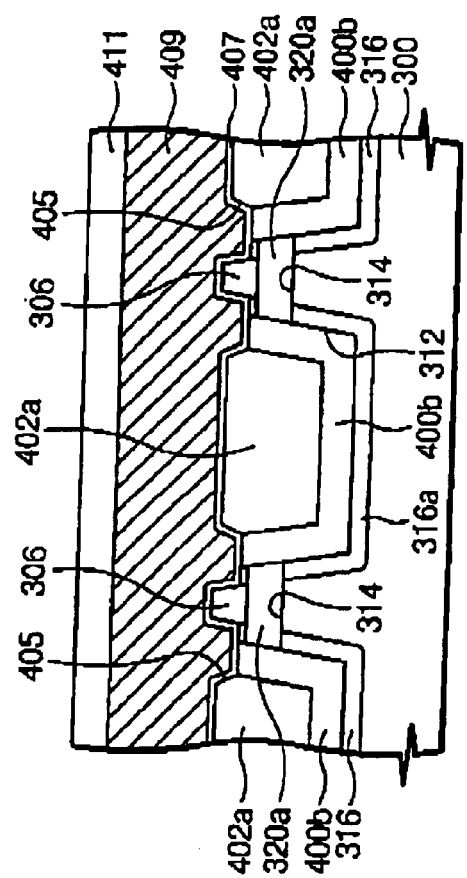

Referring to FIGS. 17A, and 17B, the trenches 312 and the vacant spaces 314 are formed as described in reference to FIGS. 10–15. Shallow trenches are formed in the substrate 300 and passivation layers are deposited to fill the shallow trenches. In some embodiments according to the invention, the passivation layers are formed of a silicon-germanium compound. The channel silicon layer 306 is deposited on the substrate 300 including on the passivation layers. The channel silicon layer 306 provides channel regions for subsequently formed transistors, and can be single crystalline silicon formed by epitaxial growth. Trench mask layer 308 is formed exposing predetermined regions on the channel silicon layer 306. The channel silicon layer 306 and the substrate are partially etched away through mask layer 308 to form the trenches 312 so that sides of the passivation layers are exposed. The exposed passivation layers 304 are selectively etched away to form the vacant spaces 314.

The buried insulation layers 320a are formed to fill the vacant spaces 314. The buried insulation layers 320a are formed of thermal oxide layers. During this, the sidewall oxide layers 316 are formed on the bottoms and sides of the trenches 312. The buried insulation layers 320a may be formed with vacancies.

A liner layer 400 of silicon-nitride is conformally deposited on the substrate 300 (including the buried insulation layers 320a) and a field isolation layer 402 of silicon-oxide is deposited on the liner layers 400 to fill the trenches 312. In some embodiments according to the invention, the liner layer 400 is an insulation layer having an etch selectivity relative to the field isolation layer 402. For example, the liner layer 400 can be silicon-nitride or silicon-oxide-nitride. The field isolation layer 402 is formed of silicon-nitride, for example.

For the purpose of reducing the ratio of length and width of the trenches 312, the trench mask layer 308 can be removed before forming the liner layer 400. A thermal oxide layer may be generated between the liner layer 400 and the active regions.

Referring to FIGS. 18A, 18B, 19A, and 19B, the field isolation layer 402, the liner layer 400, and the trench mask layer 308 are planarized by etching to expose the top surfaces of the channel silicon layers 306 to form patterned field isolation layers 402a. The liner layers 400a and the field isolation layers 402a are stacked in the trenches 312. The planarization may be carried out by means of chemical-mechanical planarization (CMP) process.

The grooves 405 are formed to expose the top surfaces the active regions. The grooves 405 expose the top surfaces of the field isolation layers 402a adjacent to the sides of the active regions. The liner layers 400a are recessed to expose the sidewall oxide layers 316 located on the top surfaces of the active regions. The exposed sidewall oxide layers 316 are removed to expose the top surfaces of the active regions, so that the grooves 405 are formed therein. While removing the exposed sidewall oxide layers 316, the top and side surfaces of the field isolation layers 402b may be recessed. Inner sidewalls of the grooves 405 are defined by the top surfaces of the active regions and the field isolation layers 402a, and the bottoms of the grooves 405 are defined by the sidewall oxide layers 316 and the liner layers 400b which are recessed.

The gate insulation layer 407 is deposited on the substrate 300 in the grooves 405. The conductive gate layer 409 is deposited on the gate insulation layer 407, filling the grooves 405. A capping insulation layer 411 is deposited on the conductive gate layer 409. The gate insulation layer 407 may be formed of a CVD silicon oxide, such as a thermal oxide layer. The conductive gate layer 409 may be formed of doped polycrystalline silicon. The conductive gate layer 409 may also include a metal silicide layer formed on the doped polycrystalline silicon layer. The doped polycrystalline silicon layer may be planar in the grooves 405. The capping insulation layer 411 is made of a dielectric (or insulation) material such as silicon-nitride or silicon-oxide-nitride.

Figure 20A:
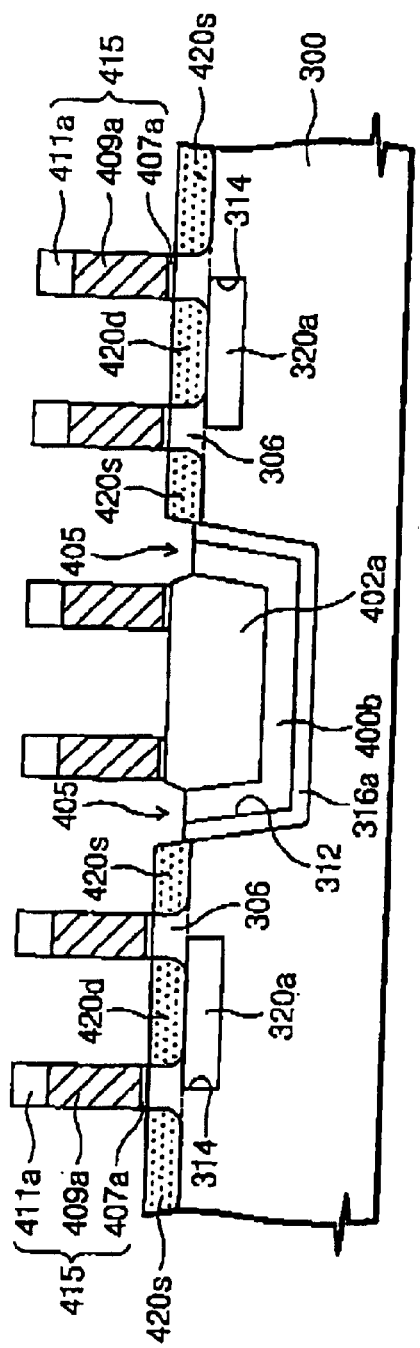
Figure 20B:
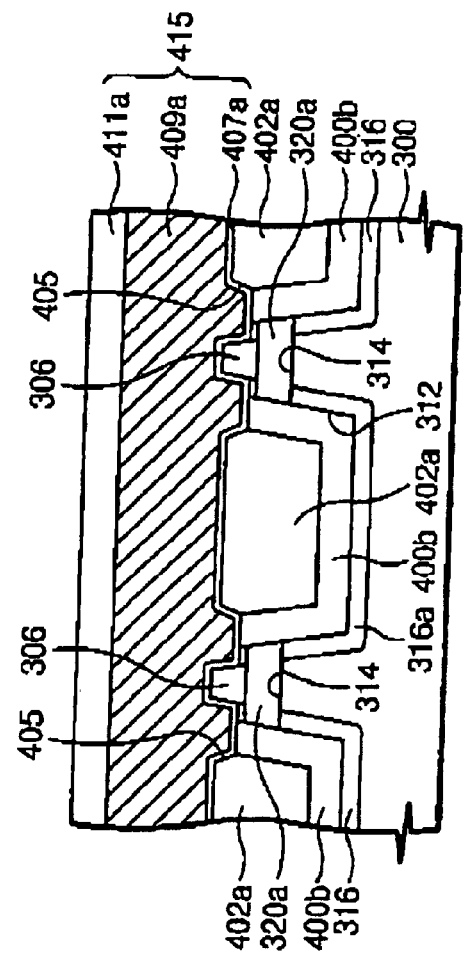

Referring to FIGS. 20A and 20B, the capping insulation layer 411, the conductive gate layer 409, and the gate insulation layer 407 are patterned according to a predetermined configuration, to form the gate layers 415 including the gate insulation layers 407a, the gate electrodes 409a, and the capping insulation layers 411a. The gate electrodes 409a are formed across the active regions and the field isolation layers 402a, filling the grooves 405 located thereunder. Thus, the gate electrodes 409a form a duplicate structure covering the top surfaces and sides of the active regions.

The gate layers 415 are used as mask layers for an ion implantation to form impurity diffusion regions that provide source and drain regions 420s and 420d respectively. Preferably, the source and drain regions 420s and 420d are disposed within the channel silicon layers 306. The drain regions 420d are formed on the buried insulation layers 320a, which can reduce short channel effects and punch-through by reducing the expansion of depletion regions around the drain regions.

In some embodiments according to the invention, gate spacers are formed on both sides of the gate layers 415. Throughout the embodiments described above, the structural elements corresponding to each other may be formed of the same material.

According to the features of the present invention, the buried insulation layers are formed under the drain regions by selectively removing silicon-germanium layers formed by epitaxial growth thereby reducing the extension of depletion regions around the drain regions, thereby reducing short channel and punch-through phenomena. The epitaxial growth techniques may take the place of expensive SOI substrates which have disadvantages of floating body effects and inefficient properties for heat transmission, enhancing product competitiveness with lower costs. Furthermore, a duplicate gate structure can be formed by recessing field isolation layers or shaping the grooves to control the channel regions defined with the exposed top and sides of the active regions more efficiently thereby reducing the short channel and punch-through effects.

While the invention has been particularly described with reference to the embodiments herein, it will be understood by those of ordinary skill in the art that various changes in form and details may be made therein without departing from the spirit and scope of the invention as defined by the following claims.

What is claimed:

1. A method of fabricating an integrated circuit device, comprising: forming a mask layer exposing a predetermined region of a substrate; etching the predetermined region through the mask layer to form at least one shallow trench in the substrate; forming a passivation layer comprising epitaxial silicon-germanium in the shallow trench; removing the mask layer; forming a channel silicon layer on the substrate and on the passivation layer; patterning the channel silicon layer and the substrate to expose sides of the passivation layer and to form a trench defining an active region; selectively removing the exposed passivation layer to form a vacant space; forming a buried insulation layer in the vacant space and forming a field isolation layer in the trench.

2. A method of according to claim 1 wherein the passivation layer and the channel silicon layer are formed by ultra-high vacuum chemical vapor deposition or low-pressure chemical vapor deposition.

3. A method according to claim 1 wherein the passivation layer comprises a material having an etch selectivity relative to the substrate and the channel silicon layer.

4. A method according to claim 1 wherein the channel silicon layer comprise epitaxially grown single crystalline silicon on the passivation layer and the substrate.

5. A method according to claim 1 wherein forming a buried insulation layer and a field isolation layer comprises:
depositing the field isolation layer to fill the vacant space and the trench; and
planarizing the field isolation layer, wherein a portion of the field isolation layer fills the vacant space to form the buried insulation layer.

6. A method according to claim 5 further comprising:
forming a thermal oxide layer in the vacant space and the trench prior to depositing the field isolation layer, wherein the thermal oxide layer in the vacant space and the field isolation layer form the buried insulation layer and the thermal oxide layer in the trench forms a sidewall oxide layer.

7. A method according to claim 1 wherein forming a buried insulation layer and the field isolation layer comprises:
forming the buried insulation layer to fill the vacant space;
depositing the field isolation layer to fill the trench; and
planarizing the field isolation layer to within the trench, wherein the buried insulation layer comprises a thermal oxide.

8. A method according to claim 7 wherein forming the buried insulation layer comprises thermally oxidizing the substrate containing the vacant space and the trench to form the buried insulation layer filling the vacant space and a sidewall oxide layer in the trench.

9. A method according to claim 1 further comprising performing the following steps after forming the buried insulation layer and the field isolation layer:
forming a gate electrode on the active region and the field isolation layer; and
forming impurity diffusion layers in the active regions on both sides of the gate electrode to provide a source and a drain region, wherein at least one of the source and drain regions is on the buried insulation layer.

10. A method according to claim 9 further comprising performing the following steps before forming the gate electrode:
recessing the field isolation layer to expose top sides of the active region, wherein the gate electrode crosses top and sides of the active region.

11. A method according to claim 1 wherein the buried insulation layer includes at least one vacancy therein.

12. A method of fabricating an integrated circuit device, comprising: forming at least one passivation layer comprising epitaxially grown silicon-germanium in a predetermined region of an integrated circuit substrate comprising: forming a mask layer; exposing the predetermined region in the substrate; etching the exposed region through the mask layer to form at least one shallow trench in the substrate; forming the passivation layer in the shallow trench; removing the mask layer; forming a channel silicon layer on the substrate and on the passivation layer; patterning the channel silicon layer and the substrate to expose sides of the passivation layer and to form a trench defining an active region; selectively removing the exposed passivation layer to form a vacant space; forming a buried insulation layer in the vacant space and forming a field isolation layer in the trench; forming a groove exposing top sides of the active region at a boundary between the field isolation layer and the active region; forming a gate electrode on the active region and the field isolation layer so that the gate electrode fills the groove; forming impurity diffusion layers in the active regions on both sides of the gate electrode to provide a source and a drain region, wherein at least one of the source and drain regions is on the buried insulation layer.

13. A method according to claim 12 wherein forming s groove comprises:
depositing a liner layer in the trench;
depositing a field isolation layer on the liner layer, filling the trench;
planarizing the field isolation layer the liner layer; and
selectively recessing the liner layer to disclose the top sides of the active region, wherein the liner layer comprises an insulation material having an etch selectivity relative to the field isolation layer.

* * * * *